United States Patent
Suzuki

(10) Patent No.: US 7,315,178 B1
(45) Date of Patent: Jan. 1, 2008

(54) SYSTEM AND METHOD FOR MEASURING NEGATIVE BIAS THERMAL INSTABILITY WITH A RING OSCILLATOR

(75) Inventor: Shingo Suzuki, San Jose, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 11/248,440

(22) Filed: Oct. 11, 2005

Related U.S. Application Data

(60) Division of application No. 10/870,752, filed on Jun. 16, 2004, now Pat. No. 7,126,365, and a continuation-in-part of application No. 10/712,847, filed on Nov. 12, 2003, now Pat. No. 6,903,564, and a continuation-in-part of application No. 10/672,793, filed on Sep. 26, 2003, now Pat. No. 6,885,210, and a continuation-in-part of application No. 10/124,152, filed on Apr. 16, 2002, now Pat. No. 6,882,172.

(51) Int. Cl.
*G01R 31/02* (2006.01)
(52) U.S. Cl. .................................................. 324/763
(58) Field of Classification Search ............... None
See application file for complete search history.

(56) References Cited

U.S. PATENT DOCUMENTS

| 4,739,252 | A | 4/1988 | Malaviya et al. |
| 5,410,278 | A | 4/1995 | Itoh et al. |
| 5,568,103 | A | 10/1996 | Nakashima et al. |
| 5,594,360 | A | 1/1997 | Wojciechowski |
| 5,680,359 | A | 10/1997 | Jeong |
| 5,764,110 | A | 6/1998 | Ishibashi |

(Continued)

FOREIGN PATENT DOCUMENTS

EP    1 398 639 A    3/2004

OTHER PUBLICATIONS

Oner, H. et al., "A Compact Monitoring Circuit for Real-Time On-Chip Diagnosis of Hot-Carrier Induced Degradation", Microelectronic Test Structures, 1997. ICMTS 1997. Proceedings, IEEE International Conference on Monterey, CA, Mar. 17, 1997-Mar. 20, 1997, pp. 72-76.

(Continued)

*Primary Examiner*—Vinh Tran Nguyen
*Assistant Examiner*—Trung Q. Nguyen

(57) ABSTRACT

An integrated circuit, in accordance with one embodiment of the present invention, includes a first device under test (DUT) module coupled to a first ring oscillator module and a second DUT module coupled to a second ring oscillator module. The first DUT module is biased such that interface traps are generated during a first mode. The generated interface traps result in a decrease in a first drive current of the first DUT module. The second device under test module is biased to maintain a reference drive current during the first mode. The operating frequency of the first ring oscillator module, during a second mode, is a function of the first drive current. The operating frequency of the second ring oscillator module, during the second mode, is a function of the reference drive current. The integrated circuit may also include a comparator module for generating an output signal as a function of a difference between the operating frequency of the first and second ring oscillator modules.

11 Claims, 3 Drawing Sheets

U.S. PATENT DOCUMENTS

| | | | |
|---|---|---|---|
| 5,796,313 A | 8/1998 | Eitan | |
| 5,811,983 A * | 9/1998 | Lundberg | 324/763 |
| 5,963,043 A | 10/1999 | Nassif | 324/681 |
| 5,977,763 A | 11/1999 | Loughmiller et al. | |
| 6,011,403 A | 1/2000 | Gillette | |
| 6,172,943 B1 | 1/2001 | Yuzuki | |
| 6,229,747 B1 | 5/2001 | Cho et al. | |
| 6,242,936 B1 | 6/2001 | Ho et al. | |
| 6,242,937 B1 | 6/2001 | Lee et al. | |
| 6,407,571 B1 | 6/2002 | Furuya et al. | |
| 6,426,641 B1 | 7/2002 | Koch et al. | |
| 6,476,632 B1 | 11/2002 | La Rosa et al. | 324/769 |
| 6,489,796 B2 | 12/2002 | Tomishima | |
| 6,535,014 B2 | 3/2003 | Chetlur et al. | |
| 6,657,504 B1 | 12/2003 | Deal et al. | |
| 6,724,214 B2 | 4/2004 | Manna et al. | 324/766 |
| 6,731,179 B2 | 5/2004 | Abadeer et al. | |
| 6,762,966 B1 | 7/2004 | LaRosa et al. | |
| 6,798,230 B1 | 9/2004 | Taylor et al. | |
| 6,815,971 B2 | 11/2004 | Wang et al. | |
| 2003/0189465 A1 | 10/2003 | Abadeer et al. | 701/200 |
| 2004/0148111 A1 | 7/2004 | Gauthier et al. | |

OTHER PUBLICATIONS

Reddy, V. et al., "Impact of Negative Bias Temperature Instability on Digital Circuit Reliability" 2002 IEEE International Reliability Physics Symposium Proceedings. Dallas, TX Apr. 7, 2002-Apr. 11, 2002; IEEE International Reliability Physics Symposium, NY, NY; IEEE, US, Apr. 7, 2002, pp. 248-254.

G. Chen, et al., "Dynamic NBTI of p-MOS Transistors and Its Impact on MOSFET Scaling," IEEE Electron Device Letters, 2002.

Laura Peters, "NBTI: A Growing Threat to Device Reliability", Semiconductor International, Mar. 1, 2004, <http://www.reed-electronics.com/semiconductor/article/CA386329?industryid=3033>.

* cited by examiner

SYSTEM AND METHOD FOR MEASURING NEGATIVE BIAS THERMAL INSTABILITY WITH A RING OSCILLATOR

CROSS-REFERENCE TO RELATED APPLICATIONS

This patent application is a Division of commonly-owned patent application Ser. No. 10/870,752, U.S. Pat. No. 7,126,365 filed on Jun. 16, 2004, entitled "SYSTEM AND METHOD FOR MEASURING NEGATIVE BIAS THERMAL INSTABILITY WITH A RING OSCILLATOR," by Shingo Suzuki, which is incorporated herein by reference. This is a continuation-in-part of U.S. patent application Ser. No. 10/712,847, U.S. Pat. No. 6,903,564 filed Nov. 12, 2003, by Shingo Suzuki, entitled "A device Age Determination circuit," U.S. patent application Ser. No. 10/672,793, U.S. Pat. No. 6,885,210 filed Sep. 26, 2003, by Shingo Suzuki, entitled "System and Method for Measuring Transistor Leakage Current with a Ring Oscillator with Backbias Controls," and U.S. patent application Ser. No. 10/124,152, U.S. Pat. No. 6,882,172 filed Apr. 16, 2002, by Shingo Suzuki, entitled "A System and Method for Measuring Transistor Leakage Current with a Ring Oscillator," which are incorporated herein by reference.

BACKGROUND OF THE INVENTION

Conventional integrated circuits suffer from numerous reliability and degradation issues. For deep submicron (DSM) designs issues such as hot carrier injection (HCI), time dependant dielectric breakdown (TDDB), negative bias thermal instability (NBTI) and the like, increasingly affect performance of integrated circuits.

In order to increase the performance of an integrated circuit various operating parameters, such as the supply voltage, operating frequency, back bias (e.g., threshold voltage), and/or the like, may be changed. However, there is typically a tradeoff between performance and lifetime of the integrated circuit. Changing the operating parameters to achieve increased performance typically results in an increase in stresses, such as negative bias thermal instability (NBTI). The tradeoff between performance and lifetime may be optimized if NBTI in the integrated circuit can be measured.

SUMMARY OF THE INVENTION

Accordingly, embodiments of the present invention are directed toward a method and system for measuring negative bias thermal instability (NBTI) in an integrated circuit, electronic device or the like. In one embodiment, an integrated circuit includes a first device under test (DUT) module coupled to a first ring oscillator module and a second DUT module coupled to a second ring oscillator module. The first DUT module is biased such that interface traps are generated during a first mode. The generated interface traps result in a decrease in a first drive current of the first DUT module. The second device under test module is biased to maintain a reference drive current during the first mode. The operating frequency of the first ring oscillator module, during a second mode, is a function of the first drive current. The operating frequency of the second ring oscillator module, during the second mode, is a function of the reference drive current. The integrated circuit may also include a comparator module for generating an output signal as a function of a difference between the operating frequency of the first and second ring oscillator modules.

In another embodiment of the present invention, a method of measuring negative bias thermal instability (NBTI) includes stressing a first MOSFET during a normal operating mode. A second MOSFET is maintained as a reference during the normal operating mode. A first and second ring oscillator modules are enabled during a test mode. The operating frequency of the first ring oscillator module is a function of the drive current of the first MOSFET. The operating frequency of the second ring oscillator module is a function of the driver current of the second MOSFET. An output signal is generated as a function of a difference between the operating frequency of the first and second ring oscillator modules during the test mode.

In yet another embodiment, a system for measuring NBTI includes a first set of inverters, a first NAND gate, a first MOSFET, a second set of inverters, a second NAND gate and a second MOSFET. The first set of inverters, a first input and an output of the first NAND gate, and a source and drain of the first MOSFET are coupled in series to form a first signal loop. A second input of the first NAND gate receives a first enable signal. A gate of the first MOSFET receives a second enable signal. The second set of inverters, a first input and an output of the second NAND gate, and a source and drain of the second MOSFET are coupled in series to form a second signal loop. A second input of the second NAND gate receives the first enable signal. A gate of the second MOSFET receives a third enable signal.

Embodiments of the present invention advantageously provide a system and method of measuring NBTI utilizing rings oscillators. The age of an associated integrated circuit, electronic device or the like may advantageously be extrapolated from the measurement of NBTI. The measurement of NBTI may also advantageously be utilized to adjust the trade-off between device performance and lifetime.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
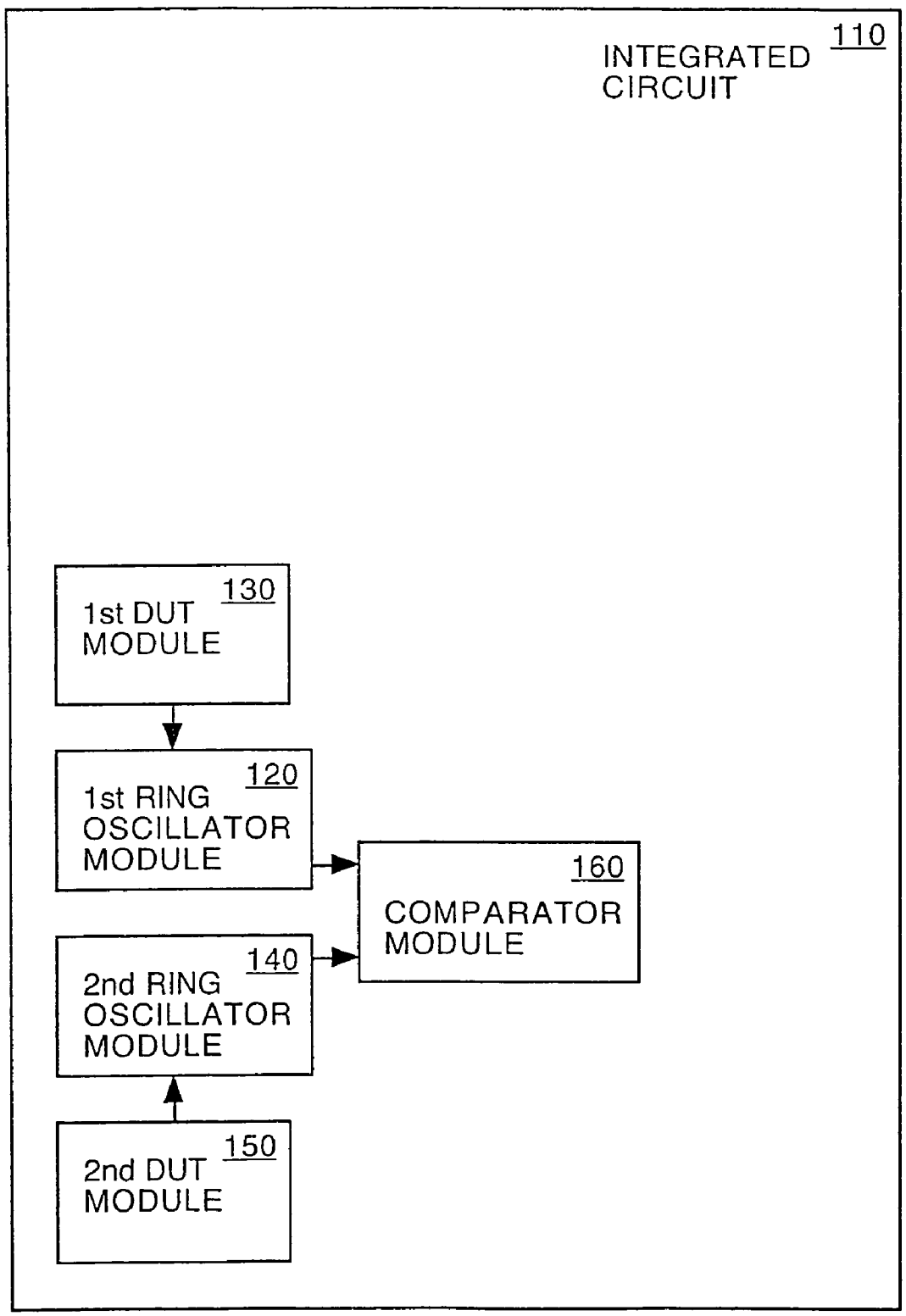
FIG. 1 shows a block diagram of a system for measuring negative bias thermal instability (NBTI) in an integrated circuit, in accordance with one embodiment of the present invention.

Referring to FIG. 1, a block diagram of a system for measuring negative bias thermal instability (NBTI) in an integrated circuit 110, in accordance with one embodiment of the present invention, is shown. As depicted in FIG. 1, the system for measuring NBTI includes a first ring oscillator module 120, a first device under test (DUT) module 130, a second ring oscillator module 140, a second DUT module 150 and a comparator module 160. The first DUT module 130 may be coupled to the first ring oscillator module 120. The second DUT module 150 may be coupled to the second ring oscillator module 140. The comparator module 160 may be coupled to the first and second ring oscillator modules 120, 140, such that the operating frequencies of the first and second ring oscillator modules 120, 140 may be compared.

In a first mode (e.g., normal operating mode), the first and second ring oscillator modules 120, 140 are disabled, such that corresponding oscillator signals are not generated. During the first mode, the first DUT module 130 (e.g., stressed module) may be biased such that interface traps are generated. The generation of interface traps causes negative bias thermal instability in the first DUT module 130. The second DUT module 150 (e.g., reference module) may be biased such that interface traps are not generated. It is appreciated that NBTI results in an increase in a threshold voltage and a decrease in drive current in the first DUT module 130 over time. The threshold voltage and drive current in the second DUT module 150, however, will remain substantially constant.

In a second mode (e.g., test mode), the first and second ring oscillator modules 120, 140 are enabled. Thus, each ring oscillator module 120, 140 generates a periodic signal having a frequency that is a function of the drive current provided by the respective DUT modules 130, 150. More specifically, the first ring oscillator module 120 generates an oscillator signal having a first operating frequency that is a function of the drive current provided by the first DUT module 130. As described above, the drive current provided by the first DUT module 130 will decrease over time during the normal operating mode. Thus, the operating frequency of the first ring oscillator module 120 will decrease over time. The second oscillator module 140 generates a second oscillator signal having a second operating frequency that is a function of the drive current provided by the second DUT module 150. As described above, the drive current provided by the second DUT module 150 will remain substantially constant over time. Thus, the operating frequency of the second ring oscillator module 140 will remain substantially constant over time.

During the second mode, the comparator module 160 compares the operating frequencies of the first and second ring oscillator modules 120, 140. Various embodiments of the comparator modules 160 are described in the following disclosures: U.S. patent application Ser. No. 10/712,847, filed Nov. 12, 2003, by Shingo Suzuki, entitled "A device Age Determination circuit," U.S. patent application Ser. No. 10/672,793, filed Sep. 26, 2003, by Shingo Suzuki, entitled "System and Method for Measuring Transistor Leakage Current with a Ring Oscillator with Backbias Controls," and U.S. patent application Ser. No. 10/124,152, filed Apr. 16, 2002, by Shingo Suzuki, entitled "A System and Method for Measuring Transistor Leakage Current with a Ring Oscillator," which are incorporated herein by reference. In one implementation, the comparator module 160 generates an output signal that is a function of the difference between the first and second operating frequencies. The signal is indicative of the extent of the NBTI degeneration in the first DUT module 130. It is appreciated that NBTI increases as the integrated circuit 110 operates over time. Thus, the age of the integrated circuit 110 may be extrapolated from the output signal generated by the comparator module 160.

It is also appreciated that the first and second operating frequencies may not be equal at an initial time (e.g., when the integrated circuit is powered up for the first time) due to process variations in manufacturing the integrated circuit 110. Accordingly, an initial measurement of the difference between the first and second operating frequencies may be made and stored as an offset for extrapolating the age of the integrated circuit 110. The offset value may be stored in a non-volatile storage module (not shown), such as a set of fuses, static memory (e.g., static ROM, static RAM, flash memory, etc.), and the like, internal or external to the integrated circuit 110.

It is appreciated that the comparator module 160 is an optional element of the system for measuring NBTI. The function of the comparator module 160 may also be implemented external to the integrated circuit 110. Furthermore, although embodiments of the present invention are described as being included in an integrated circuit 110, it is appreciated that the system for measuring NBTI may be utilized in conjunction with various other electronic devices.

Figure 2A:
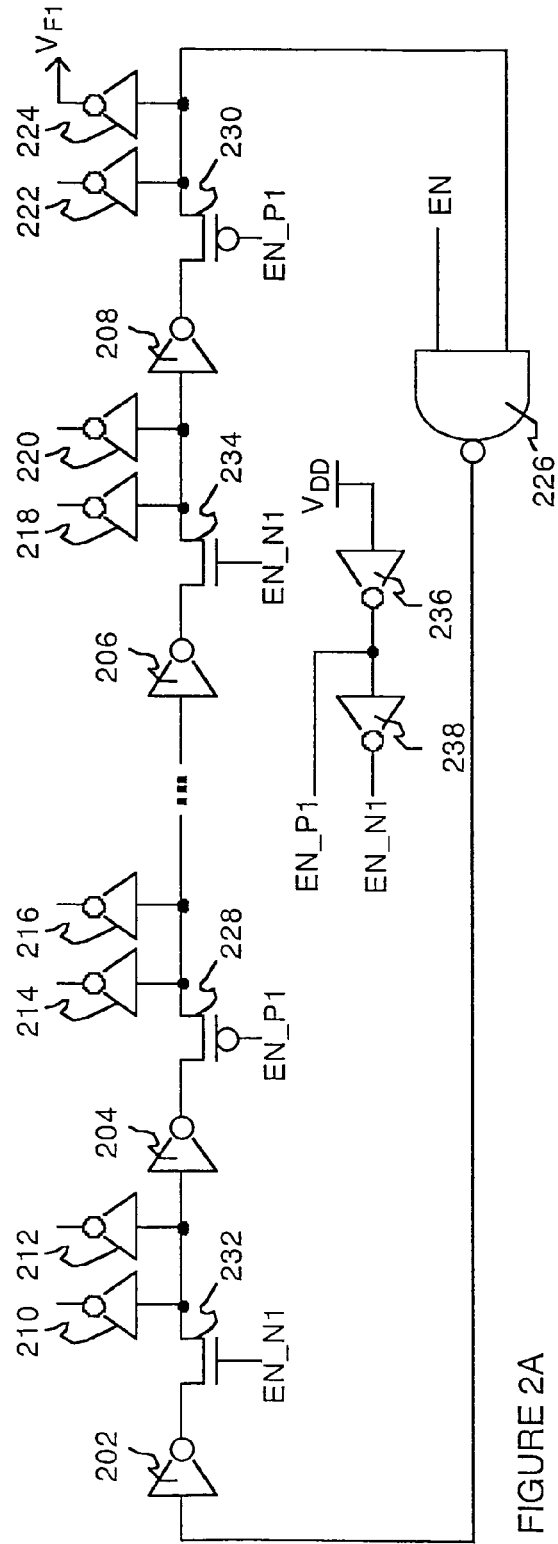
FIGS. 2A and 2B show a block diagram of an exemplary implementation of a system for measuring negative bias thermal instability (NBTI), in accordance with one embodiment of the present invention.
Figure 2B:
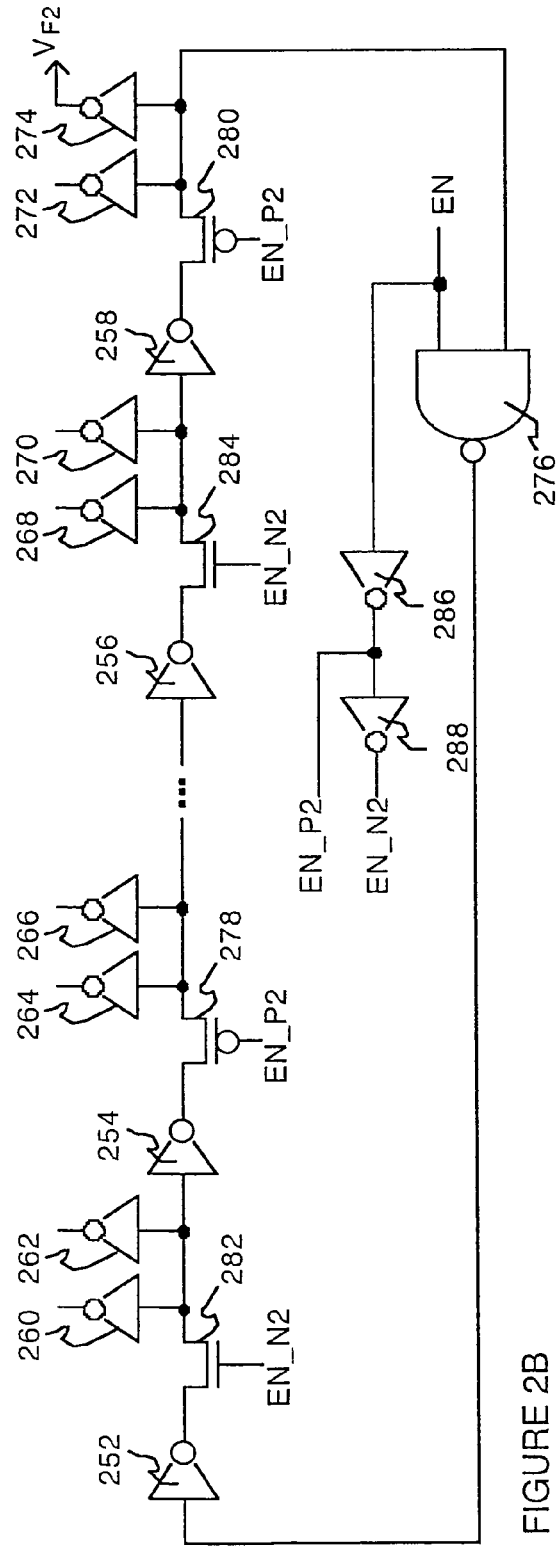

Referring now to FIGS. 2A and 2B, a block diagram of an exemplary implementation of a system for measuring negative bias thermal instability (NBTI), in accordance with one embodiment of the present invention, is shown. It is appreciated that NBTI degradation effect is more pronounced for p-channel metal-oxide-semiconductor field effect transistors (P-MOSFET) than n-channel metal-oxide-semiconductor field effect transistors (N-MOSFET) due to the presence of holes in the P-MOSFET inversion layer that are known to interact with the oxide states. Accordingly, the exemplary apparatus is adapted to measure NBTI in P-MOSFETs. The N-MOSFETs in the exemplary implementation are primarily included to provide symmetry. The system for measuring NBTI includes a first ring oscillator module 120, a first DUT module 130, a second ring oscillator module 140 and a second DUT module 150.

As depicted in FIG. 2A, the first ring oscillator module 120 includes a first set of inverters 202–208 coupled in series with each other to form a first signal loop. Each one of the first set of inverters 202–208 may have one or more load gates 210–224 coupled thereto for drawing an appropriate fan-out current. The first ring oscillator module 120 may also include a first NAND gate 226 having a first input and an output coupled in between a first and second one of the first set of inverters 202–208. A second input of the first NAND gate 226 may be coupled to an enable signal (EN). The combination of the first set of inverters 202–208 and the first NAND gate 226 results in an odd number of logic state inversions of a first oscillator signal propagating along the first signal loop. It is appreciated that a given one of the first set of inverters 204–208 or the NAND gate 226 also contributes to the fan-out current of the previous one of the first set of inverters 202–208.

The first DUT module 130 may include a first set of one or more p-channel metal-oxide-semiconductor field effect transistors (P-MOSFET) 228, 230 and/or one or more n-channel metal-oxide-semiconductor field effect transistors (N-MOSFET) 232, 234. Each P-MOSFET 228, 230 of the first set may be coupled in the first signal loop such that its source is coupled to the output of a respective one of the first set of inverters 204, 208 and its drain is coupled to a next one of the first set of inverters 206 or the first NAND gate 226. Each N-MOSFET 232, 234 of the first set may be coupled in the first signal loop such that its drain is coupled to the output of a respective one of the first set of inverters 202, 206 and its source is coupled to a next one of the first set of inverters 204, 208. If the first DUT module 130 includes a first set of both P-MOSFETs 228, 230 and N-MOSFETs 232, 234, the P-MOSFETs and N-MOSFETs may be alternatingly coupled in the first signal loop.

The first DUT module 130 may also include a second set of inverters 236, 238 coupled in series with each other. The input of a first one of the second set of inverters 236 may be coupled to a first potential (e.g., supply voltage). A first DUT enable signal (EN_P1) is generated at the output of the first one of the second set of inverters 236. The input of a second one of the second set of inverters 238 may be coupled to the output of the first one of the second set of inverters 236. A second DUT enable signal (EN_N1) is generated at the output of the second one of the second set of inverters 238. The gates of each of the first set of P-MOSFET 228, 230 may receive the first DUT enable signal (EN_P1). The gates of each of the first set of N-MOSFET 232, 234 may receive the second DUT enable signal (EN_N1).

As depicted in FIG. 2B, the second ring oscillator module 140 includes a third set of inverters 252–258 coupled in series with each other to form a second signal loop. Each one of the third set of inverters 252–258 may have one or more load gates 260–274 coupled thereto for drawing an appropriate fan-out current. The second ring oscillator module 140 may also include a second NAND gate 276 having a first input and an output coupled in between a first and second one of the third set of inverters 252–258. A second input of the second NAND gate 276 may be coupled to an enable signal (EN). The combination of the third set of inverters 252–258 and the second NAND gate 276 results in an odd number of logic state inversions of a second oscillator signal propagating along the second signal loop. It is appreciated that a given one of the third set of inverters 254–258 or the NAND gate 276 also contributes to the fan-out current of the previous one of the third set of inverters 252–258.

The second DUT module 150 may include a second set of one or more P-MOSFETs 278, 280 and/or one or more N-MOSFETs 282, 284. Each P-MOSFET 278–280 of the second set may be coupled in the second signal loop such that its source is coupled to the output of a respective one of the third set of inverters 254–258 and its drain is coupled to a next one of the third set of inverters 256 or the second NAND gate 276. Each N-MOSFET 282, 284 of the second set may be coupled in the signal loop such that its drain is coupled to the output of a respective one of the third set of inverters 252, 256 and its source is coupled to a next one of the third set of inverters 254, 258. If the second DUT module 150 includes a first set of both P-MOSFETs 278, 280 and N-MOSFETs 282, 284, the P-MOSFETs 278, 280 and N-MOSFETs 282, 284 may be alternatingly coupled in the second signal loop.

The second DUT module 150 may also include a fourth set of inverters 286, 288 coupled in series with each other. The input of a first one of the fourth set of inverters 286 may receive the enable signal (EN). A third DUT enable signal (EN_P2) is generated at the output of the first one of the fourth set of inverters 286. The input of a second one of the fourth set of inverters 288 may be coupled to the output of the first one of the fourth set of inverters 286. A fourth DUT enable signal (EN_N2) is generated at the output of the second one of the fourth set of inverters 286. The gates of each of the second set of P-MOSFET 278, 280 may receive the third DUT enable signal (EN_P2). The gates of each of the second set of N-MOSFET 282, 284 may receive the fourth DUT enable signal (EN_N2).

In a first mode (e.g., normal operating mode), the first ring oscillator module 120 does not generate a first oscillator signal ($V_{F1}$). More specifically, a low state enable signal (EN) is received at the first input of the first NAND gate 226. When the first input of the first NAND gate 226 is low, the output of the first NAND gate 226 is high regardless of the state of the second input of the first NAND gate 226. Hence, the first NAND gate 226 maintains a steady state around the first signal loop.

In the first mode, the first DUT enable signal (EN_P1) is low and the second DUT enable signal (EN_N1) is high. Thus, the gate of each N-MOSFET of the first DUT module 130 is high (e.g., supply voltage ($V_{DD}$)), and the gate of each P-MOSFET is low (e.g., ground ($V_{SS}$)). When the output of the first NAND gate 226 is high, each of the first set of inverter 202–208 biases the source and drain of a corresponding one of the P-MOSFETs 228, 230 at a high state (e.g., the source voltage ($V_{DD}$)). Accordingly, the P-MOSFETs 228, 230 and/or N-MOSFETs 232, 234 of the first set are stressed (e.g., biased such that interface traps between the gate oxide and the silicon substrate are generated). The threshold voltage of the first set of P-MOSFETs 228, 230 and/or N-MOSFETs 232, 234 increases and the drive current decreases as a result of the NBTI stress during the first mode.

In the first mode, the third DUT enable signal (EN_P2) is high and the fourth DUT enable signal (EN_N2) is low. Thus, the gate of each N-MOSFET 282, 284 of the second DUT module 150 is low (e.g., ground ($V_{SS}$)), and the gate of each P-MOSFET 278, 280 is high (e.g., the supply voltage ($V_{DD}$)). When the output of the second NAND gate 276 is high, each of the second set of inverters 252–258 bias the source and drain of each P-MOSFET 278, 280 at a low state (e.g., ground ($V_{SS}$)). Accordingly, the P-MOSFETs 278, 280 and/or N-MOSFETs 282, 284 of the third set are not stressed, thereby providing a reference for determining NBTI.

It is appreciated that the period of time of operating in the first mode may be substantially equal to the period of time that an associated circuit, electronic device or the like, is operating. Accordingly, the first set of P-MOSFETs 228, 230 and/or N-MOSFETs 232, 234 age at substantially the same rate as P-MOSFET and/or N-MOSFET devices utilized in the integrated circuit, electronic device, or the like. Alternatively, the first set of P-MOSFETs 228, 230 and/or N-MOSFETs 232, 234 may represent the worst case of the integrated circuit for a conservative lifetime estimation. However, the third set of P-MOSFETs 278, 280 and/or N-MOSFETs 282, 284 are not stressed and therefore do not age an appreciable amount during the first mode.

In a second mode (e.g., test mode), the first DUT enable signal (EN_P1) is low and the second DUT enable signal (EN_N1) is high. Thus, the gate of each N-MOSFET 232, 234 of the first DUT module 130 is high (e.g., supply voltage ($V_{DD}$)), and the gate of each P-MOSFET 228, 230 is low (e.g., ground ($V_{SS}$)). When the enable signal (EN) switches to a high state, the first ring oscillator module 120 generates a first oscillator signal ($V_{F1}$). If the first DUT module 130 contains only P-MOSFETs, the operating frequency of the first oscillator signal ($V_{F1}$) will be a function of the drive current of the P-MOSFETs. If the first DUT module 130 contains only N-MOSFETs, the operating frequency of the first oscillator signal ($V_{F1}$) will be a function of the drive current of the N-MOSFETs. If the first DUT module 130 contains both N-MOSFETs and P-MOSFETs, the operating frequency of the first oscillator signal ($V_{F1}$) will be primarily a function of the drive current of the P-MOSFETs, with a minor influence on the operating frequency caused by the N-MOSFETs. It is appreciated, from the above-description of the normal operating mode, that over time the first set of MOSFETs are stressed resulting in NBTI that will cause a decrease in the drive current over time. Accordingly, the operating frequency of the first oscillator signal ($V_{F1}$) will decrease over time.

In the second mode, the third DUT enable signal (EN_P2) switches to a low state and the fourth DUT enable signal (EN_N2) switches to a high state, when the enable signal switches to a high state. Thus, the gate of each N-MOSFET 282, 284 of the second DUT module 150 is high (e.g., supply voltage ($V_{DD}$)), and the gate of each P-MOSFET 278, 280 is low (e.g., ground ($V_{SS}$)). Thereafter, the second ring oscillator module 140 generates a second oscillator signal ($V_{F2}$). It is appreciated, from the above-description of the normal operating mode, that the drive current of the third set of MOSFETs will remain substantially constant over time. Accordingly, the operating frequency of the second oscillator signal ($V_{F2}$) will remain substantially constant. In an actual case, it may not be constant due to drive current degradation in the third set of inverters 252, 254, 256, 258 and the second NAND gate 276. However, the rate of the "native" drive current degradation is the same in both the first and the second ring oscillator modules 120, 140. Hence, the difference between the operating frequencies of ring oscillator modules 120, 140 indicates the age of the device under test.

Negative bias thermal instability may be measured by determining the difference between the operating frequency of the first and second oscillator signals ($V_{F1}$, $V_{F2}$). It is appreciated that the operating frequency of the first and second oscillator signals ($V_{F1}$, $V_{F2}$) may be measured at any node of the first and second signal loops. It is also appreciated that NBTI in the system will increase over time. Thus, the age of the associated integrated circuit, electronic device or the like, may be extrapolated from the measurement of NBTI. To determine the age of the integrated circuit, electronic device, or the like, the second mode (e.g., test mode) may be initiated periodically or in response to a measurement request.

It is appreciated that the difference between the operating frequencies of the first and second ring oscillator modules 120, 140 may be utilized to adjust the trade-off between device performance and lifetime. The trade-off between device performance and lifetime may be adjusted by adjusting various parameters, such as supply voltage level, operating frequency, back bias (e.g., threshold voltage), operating temperature and/or the like in response to the difference between the operating frequencies of the first and second ring oscillator modules 120, 140 (e.g., age of the device).

It is also appreciated that in the first mode, the first set of MOSFETs 228–234 are subject to static NBTI (e.g., DC stress), which leads to relatively rapid degeneration of the threshold voltage and drive current parameters. The rapid degradation caused by DC stress results in a relatively short lifetime of the MOSFETs 228–234. In the second mode, the first and second sets of MOSFETs 228–234, 278–284 are subject to dynamic NBTI (e.g., AC stress). When the DC stress is periodically interrupted (e.g., AC stress is applied), the degradation is at least partially recovered (e.g., the interface traps generated during the on state of the MOSFETs 228–234 are partially annealed during their off state) and the lifetime of the MOSFETs 228–234 is increased. Accordingly, measurement of NBTI shortly after (e.g., within a few seconds or less) switching from the first state (e.g., static NBTI) to the second state (e.g., dynamic NBTI) may allow for determining the extent of static NBTI. Continued measurement during the second state may allow for determining the amount and rate of recovery from NBTI degradation.

Figure 3:
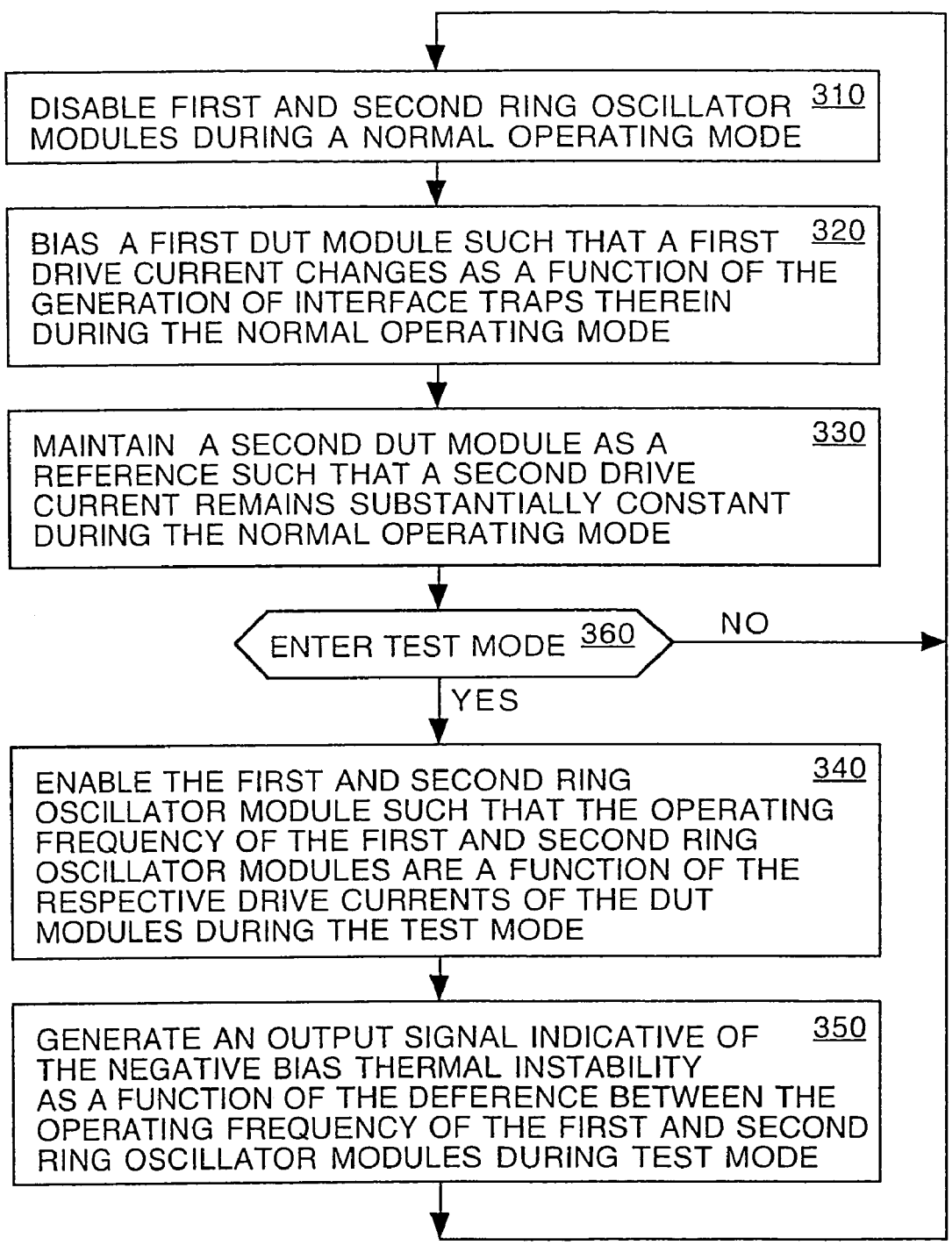
FIG. 3 shows a flow diagram of steps of a method of measuring negative bias thermal instability (NBTI), in accordance with one embodiment of the present invention.

Referring now to FIG. 3, a flow diagram of steps of a method of measuring negative bias thermal instability (NBTI), in accordance with one embodiment of the present invention, is shown. As depicted in FIG. 3, the method of measuring NBTI includes a normal operating mode and a test mode. In the normal operating mode, first and second ring oscillator modules may be disabled, at 310. In one implementation, first and second NAND gates, of the respective first and second ring oscillator modules, receive an enable signal at a respective first input. A respective second input and a respective output of the NAND gates are coupled in series in a feedback loop of the respective ring oscillator modules. In the normal operating mode, the enable signal is at a first state (e.g., low voltage level) and therefore the output of each of the NAND gates are at a second state (e.g., high voltage level). When the outputs of the NAND gates are held at the second state, the first and second ring oscillator modules do not generate oscillator signals.

At 320, a first DUT module, coupled to the first ring oscillator module, may be biased such that interface traps are generated between a gate oxide and a substrate during the normal operating mode. The generation of interface traps results in a decrease in a drive current in the first DUT module over time.

At 330, a second DUT module, coupled to the second ring oscillator module, may be maintained as a reference during the normal operating mode. Accordingly, the drive current in the first DUT module remains substantially constant over time.

At 340, the first and second ring oscillator modules may be enabled during the test mode. The operating frequencies of the first and second ring oscillator modules are each a function of the drive current of the respective DUT module coupled thereto. In one implementation, the enable signal may be switched to a second state (e.g., high voltage level), and therefore, the output of each of the NAND gates are at the first state (e.g., low voltage level). When the output of the NAND gates are held at the first state, and the first and second ring oscillator modules generate oscillator signals having operating frequencies that are a function of the respective drive currents.

At 350, the operating frequencies of the first and second ring oscillator modules may be compared during the test mode. A signal indicative of the effect of NBTI may be generated as a result of the comparison. It is appreciated that the age of an integrated circuit may then be extrapolated from the result of the comparison.

The test mode may be entered upon one or more conditions, at 360. In one implementation, the test mode may be initiated periodically or in response to a measurement request. It is appreciated that the period of time of the test mode should be negligible compared to the normal operating mode.

Accordingly, embodiments of the present invention provide a system and method of measuring negative bias thermal instability utilizing ring oscillators. The age of an associated integrated circuit, electronic device or the like may advantageously be extrapolated from the measurement of the NBTI. The measurement of NBTI may also advantageously be utilized to adjust the trade-off between device performance and lifetime.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An integrated circuit comprising:
    a first device under test module biased wherein generated interface traps cause a decrease in a first drive current during a first mode;
    a second device under test module biased to maintained a reference drive current during said first mode;
    a first ring oscillator module coupled to said first device under test module and for generating a first oscillator signal during a second mode, wherein an operating frequency of said first oscillator signal is a function of said first drive current; and
    a second ring oscillator module coupled to said second device under test module and for generating a second oscillator signal during a second mode, wherein an operating frequency of said second oscillator signal is a function of said reference drive current.

2. The integrated circuit of claim 1, further comprising a comparator module coupled to said first ring oscillator module and said second ring oscillator module for generating an output signal as a function of a difference between said operating frequency of said first oscillator signal and said operating frequency of said second oscillator signal.

3. The integrated circuit of claim 1, wherein:
    said first device under test module comprises a p-channel metal-oxide-semiconductor field effect transistor; and
    said second device under test module comprises a p-channel metal-oxide-semiconductor field effect transistor.

4. The integrated circuit of claim 1, wherein:
    said first device under test module comprises an n-channel metal-oxide-semiconductor field effect transistor; and
    said second device under test module comprises an n-channel metal-oxide-semiconductor field effect transistor.

5. The integrated circuit of claim 1, wherein:
    said first device under test module comprises a p-channel metal-oxide-semiconductor field effect transistor and an n-channel metal-oxide-semiconductor field effect transistor; and
    said second device under test module comprises a p-channel metal-oxide-semiconductor field effect transistor and an n-channel metal-oxide-semiconductor field effect transistor.

6. The integrated circuit of claim 1, wherein:
    said first device under test module is coupled in series in a feedback loop of said first ring oscillator module; and
    said second device under test module is coupled in series in a feedback loop of said second ring oscillator module.

7. A system for measuring negative bias thermal instability comprising:
    a first set of inverters coupled in series to form a first signal loop;
    a first NAND gate having a first input coupled to a first enable signal and having a second input and an output coupled in series in said first signal loop;
    a first MOSFET having a source and a drain coupled in series in said first signal loop and having a gate coupled to a second enable signal;
    a second set of inverters coupled in series to form a second signal loop;
    a second NAND gate having a first input coupled to said first enable signal and having a second input and an output coupled in series in said second signal loop; and
    a second MOSFET having a source and drain coupled in series in said second signal loop and having a gate coupled to a third enable signal.

8. The system of claim 7, wherein said first MOSFET and said second MOSFET are p-channel MOSFETs.

9. The system of claim 7, wherein said first MOSFET and said second MOSFET are n-channel MOSFETs.

10. The system of claim 7, further comprising:
    a third MOSFET having a source and a drain coupled in series in said first signal loop and having a gate coupled to a fourth enable signal; and
    a fourth MOSFET having a source and drain coupled in series in said second signal loop and having a gate coupled to a fifth enable signal.

11. The system of claim 10, wherein:
    said first MOSFET and second MOSFET are p-channel MOSFETs; and
    said third MOSFET said fourth MOSFET are n-channel MOSFETs.

* * * * *